AUTOMATIC FINE TUNING CIRCUIT USING CAPACITANCE DIODES

Filed Nov. 13, 1962 3 Sheets-Sheet 1

INVENTOR
Ernst Klettke
BY Spencer & Kaye
ATTORNEYS

INVENTOR
Ernst Klettke
BY Spencer & Kaye
ATTORNEYS

INVENTOR
Ernst Klettke

BY Spencer & Kaye

ATTORNEYS 3,233,179
AUTOMATIC FINE TUNING CIRCUIT USING CAPACITANCE DIODES

Ernst Klettke, Hannover, Germany, assignor to Telefunken Patentverwertungs-G.m.b.H., Ulm (Danube), Germany Filed Nov. 13, 1962, Ser. No. 236,785
Claims priority, application Germany, Nov. 13, 1961, T 21,100
4 Claims. (Cl. 325—469)

The present invention relates to an electronic circuit, and particularly to an arrangement for electronically tuning communication equipment.

There exist superheterodyne receiver circuits in which the intermediate frequency (IF) is applied to a discriminator which is tuned to the nominal or intended value of the intermediate frequency, this discriminator putting out a control voltage with which the oscillator circuit is regulated, for example via a capacitance diode, in such a manner that the intermediate frequency will always be at the nominal value at which it is supposed to be. The operating point of such a capacitance diode will be selected to be at that point of the diode characteristic (capacitance as a function of the inverse voltage) at which this characteristic is of maximum slope and linearity.

Such control circuits are well known in the automatic tuning art, particularly in ultra short wave, i.e., ultra high frequency or UHF, and television receivers. It is also known to tune an oscillator electronically by means of a circuit comprising a diode and a serially connected capacitor, which circuit is in parallel with a frequency determining resonant circuit, the resistance value of which series circuit is controlled by means of a direct current. In this way, the reactance of the capacitor is changed and the tuning of the resonant circuit is changed. These known circuits are so designed that only a fine tuning can be obtained within a small range, while coarse tuning is effected by other means.

It is, therefore, the object of the present invention to overcome the above drawbacks, and, more particularly, to provide a circuit for tuning communication equipment by means of one or more diodes whose capacitance or resistance can be changed by varying their bias, in which circuit the capacitance characteristics of the diode or diodes is such that the receiver can be tuned, for selective reception, over the entire frequency band to be received. In lieu of multiple rotary capacitors, variometers or switchable coils, two capacitance diodes are connected in the selective receiving or input circuit and the oscillator circuit, respectively, and by varying an inverse or reversed bias voltage common to the two diodes, the tuning of both circuits can be changed simultaneously. This can, in practice, be done by using a potentiometer having a relatively low carrying capacity, from which the direct current voltage for the diodes is tapped off. Furthermore, such an electronic tuning can be remotely controlled in a very simple manner because only one direct current voltage is transmitted. Additionally, the physical size of such a tuning arrangement is substantially reduced because no mechanical tuning means, and drive means therefor, are required.

Experience has shown that a circuit of the above type is reltively sensitive to voltage fluctuations of the power supply, because these fluctuations affect the potential used for the tuning and therefore the control voltage for the diodes, thereby changing the tuning of the resonant circuits. Furthermore, fluctuations of the supply voltage change the A.C. voltage amplitude at the diodes, so that, due to the non-linear diode characteristic, the average capacitance of the diode and hence the tuning of the circuit are changed. It is true that this drawback could be eliminated by stabilizing the supply voltage, but this, in the case of radio and television receivers, is somewhat too expensive and impractical a way to achieve the desired result. It is therefore of particular significance that a circuit according to the present invention incorporates an automatic sharp tuning feature.

According to a preferred embodiment of the present invention, the electronic tuning is combined with automatic sharp tuning as follows: the manually set D.C. voltage applied to the diodes has superposed on it a control voltage derived from the discriminator. However, the operating point on the characteristic of the diode will, by the manually set diode bias, be shifted within wide limits, so that, due to the non-linearity of the characteristic, the slope thereof will likewise vary within wide limits, depending on the operating point. The slopes at the different points will differ from each other by several orders of magnitude. Thus, the automatic control voltage which also acts at any particular point will affect the resonant circuit in any one of several widely varying degrees, i.e., the control slope of the entire circuit will vary within very wide limits.

More particularly, the present invention resides in a piece of communication equipment adapted for operation within a given frequency band, there being a circuit arrangement for electronically tuning the same. The arrangement comprises resonant circuit means incorporating capacitance diode means of the type whose capacitance can be varied by means of a bias voltage, and bias means for applying a bias voltage to the diode means for tuning the resonant circuit means. The diode means have a capacitance range which allows the diode means, under the influence of the bias means, to undergo such capacitance changes as will permit the resonant circuit means to be tuned throughout the entire range of the given frequency band. The circuit arrangement will preferably include a voltage divider and means for causing a flow of current therethrough, thereby producing the needed biasing voltage, and, in order to obtain stability of operation, a further current, derived from the frequency control circuit of the equipment, is also caused to flow through the voltage divider.

Additional objects and advantages of the present invention will become apparent upon consideration of the following description when taken in conjunction with the accompanying drawings in which.

Figures 3, 3A, 3B, 3C:
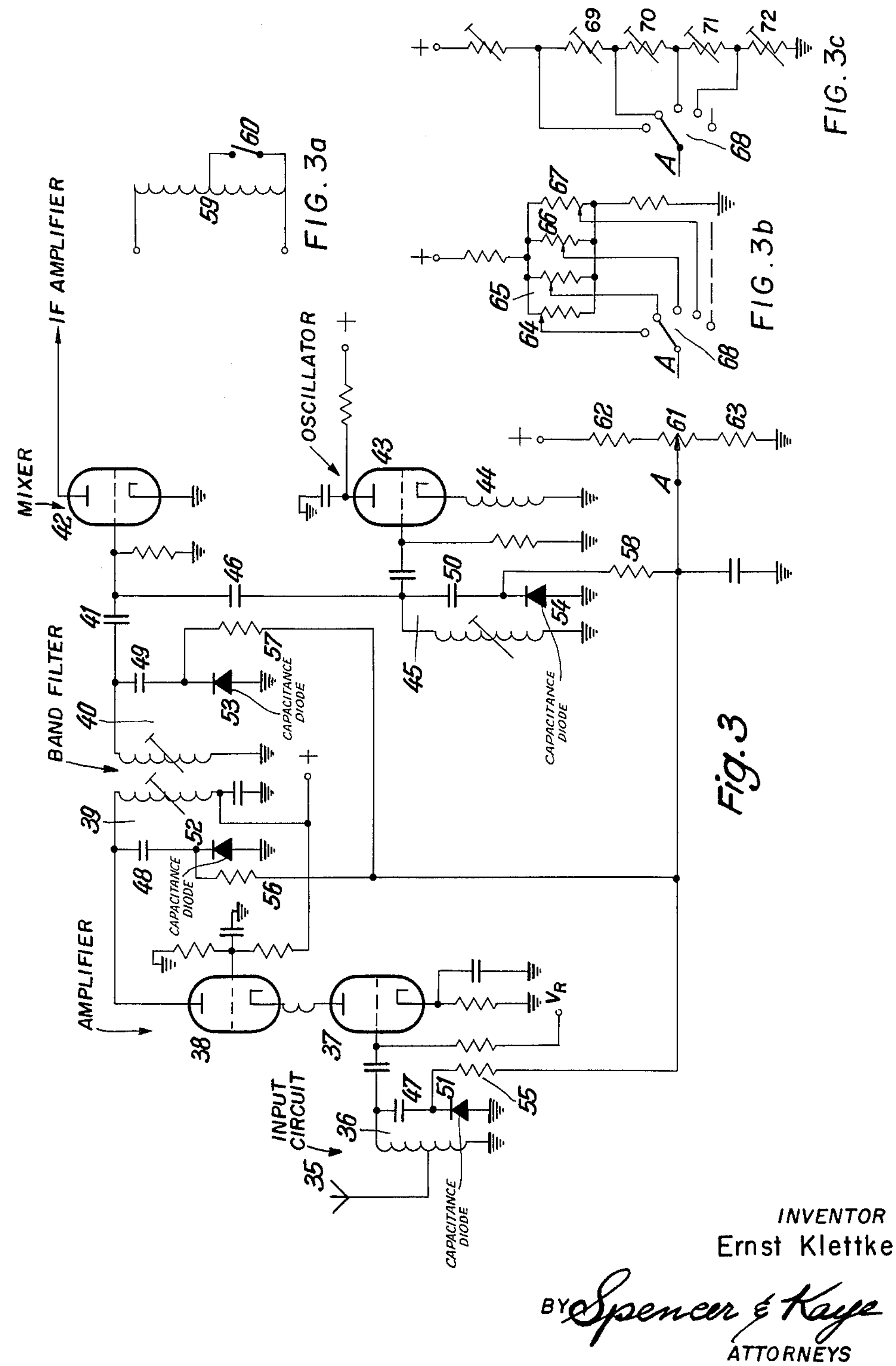
FIGURE 3 is a circuit diagram of another embodiment of the present invention, the circuit shown being particularly adapted for use in a television channel switching arrangement.

FIGURE 3*a* shows a modification of a detail.

FIGURE 3*b* shows a modification of another detail.

FIGURE 3*c* shows another modification of the last-mentioned detail.

Figure 2:
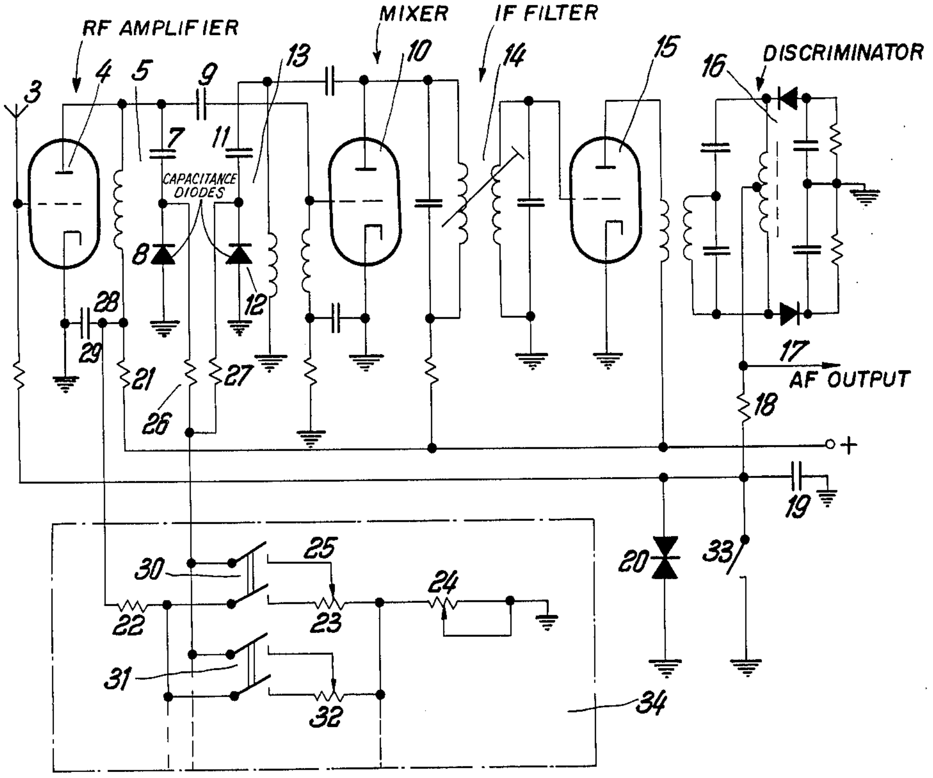
FIGURE 2 is a circuit diagram of one embodiment of the present invention.
Figure 4:
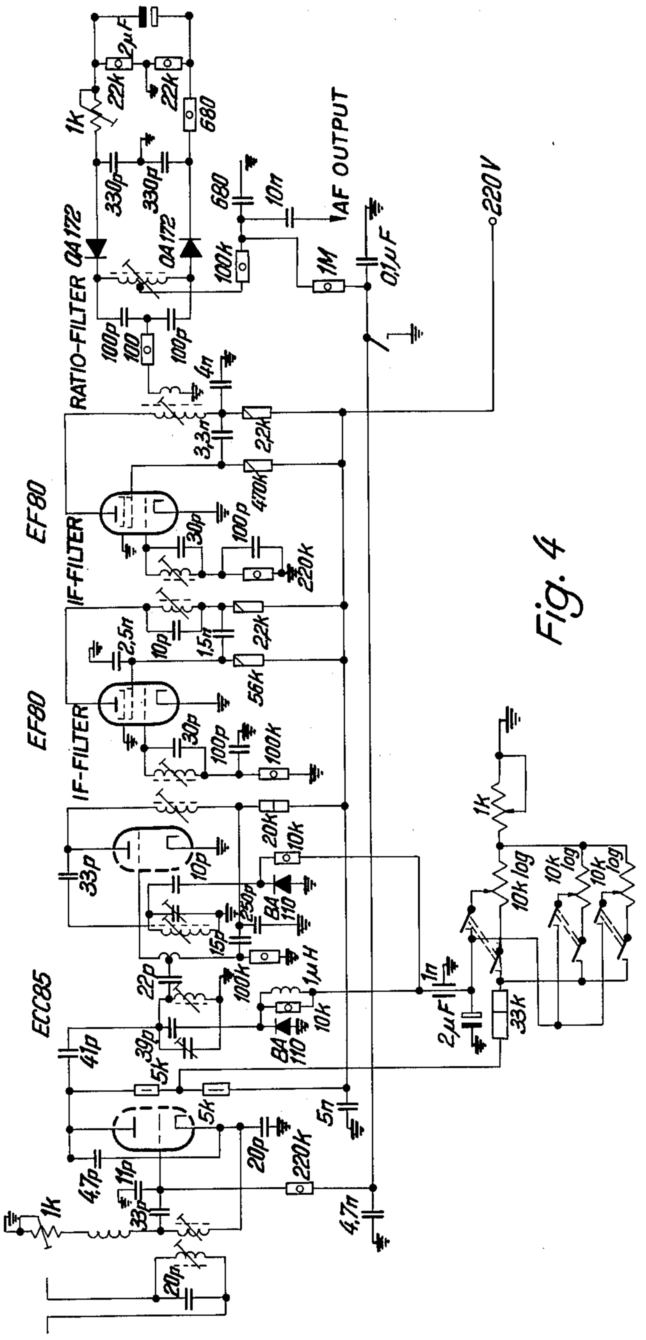

FIGURE 4 is a circuit diagram showing a practical system according to the embodiment of FIGURE 2.

Figure 1:
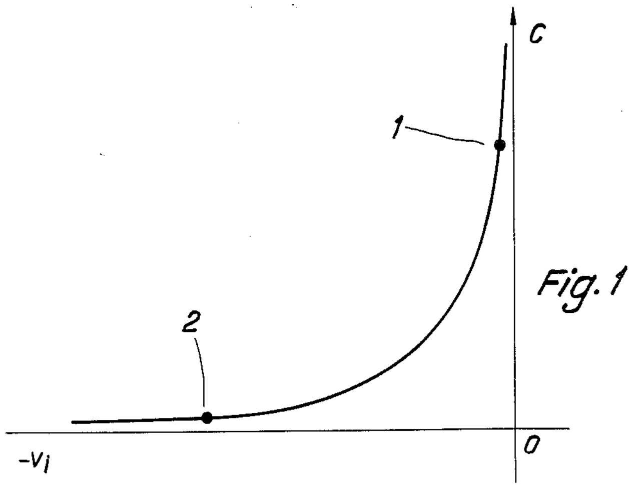
FIGURE 1 is a capacitance versus inverse voltage plot, showing the characteristic of a capacitance diode of the type used in the circuit according to the present invention.

Referring now to the drawings and to FIGURE 1 thereof in particular, the same shows the characteristic of a capacitance diode, namely, a plot of the barrier layer capacitance C as a function of the inverse voltage $V_1$. At low receiving frequencies, i.e., high capacitance and low inverse voltage, the diode is operated at point 1 so that the control circuit operates at the point at which the characteristic of the diode is at maximum slope. At high frequencies, i.e., low capacitance and high inverse voltage, the operating point lies at 2, and the automatic regulation can barely be carried out due to the small slope of the characteristic. This drawback is avoided by another feature of the present invention, in that the bias voltage for the diodes is derived from a voltage divider through which flows a constant direct current and a direct control current which itself is derived from a frequency control circuit.

The circuit according to the instant invention will now be described with reference to FIGURE 2, which shows an antenna 3 feeding a high or radio frequency (RF) amplifier tube 4 of the input stage of a UHF receiver, the anode of the tube being connected to a resonant circuit 5 which is tunable to the frequency to be received. The capacitance of this resonant circuit is constituted by a capacitor 7 and a capacitance diode 8 which is serially connected therewith. The amplified RF voltage is applied, via a capacitor 9, to the grid of a self-oscillating mixer stage triode 10. As in the case of the resonant circuit 5 of the input stage, the capacitance of the resonant circuit of the oscillator is constituted by a series circuit composed of a capacitor 11 and a capacitance diode 12. The intermediate frequency formed and amplified by tube 10 is applied to the intermediate frequency filter 14 of a further amplifier tube 15, the output of which is connected to a discriminator 16 which is tuned to the intermediate frequency. The output 17 of the discriminator delivers the audio frequency (AF) and, via an RC-circuit 18, 19, a control voltage which is applied to the grid of the input stage tube 4. The anode circuit of this tube 4 contains, in series with the tunable resonant circuit 5, an ohmic resistance 21, the junction point 28 being grounded for high frequencies by means of a capacitor 29 and being itself connected to ground via a resistance 22, a potentiometer 23, and a resistance 24.

The resistance chain 21, 22, 23, 24, through which flows a direct current, is so designed that the D.C. voltage which is taken off the tap 25 of the potentiometer 23 and which is applied, via resistances 26, 27, to the capacitance diodes 8, 12, whereat it serves as the blocking voltage, is varied within the desired limits, for example, the points 1 and 2 shown in FIGURE 1. The value of resistance 24 determines the minimum inverse voltage for the diodes, as given by point 1.

The inductances of resonant circuits 5, 13, the capacitors 7, 11, and the capacitance variations of the diodes 8, 12 (points 1 and 2 of FIGURE 1) are so selected that the receiver can be tuned through the entire UHF band by means of the potentiometer 23 which controls both of the diodes 8, 12, in synchronism with each other.

The tube 4 has a two-fold purpose. For one thing, the tube serves as a high frequency or RF amplifier, and for another, it serves as the D.C. voltage amplifier and potential former for the control voltage which passes from point 28, via the resistance 22, to the potentiometer. The great difference in the slope of the characteristic at points 1 and 2 (FIGURE 1) is compensated for as follows:

At the lowest received frequencies, i.e., high parallel capacitance and low inverse voltage (point 1), the slope of the characteristic is large. However, inasmuch as the tap 25 of potentiometer 23 will then be at the rightmost end position, only a small portion of the amplified control voltage appearing at point 28 will be taken off. For the opposite case, i.e., at the highest received frequencies, at which there is low parallel capacitance and high inverse voltage (point 2 of FIGURE 1), the slope of the characteristic will be small, but since the tap 25 will now be in leftmost end position, a large control voltage is taken off.

It has been found that, with such a circuit, the control slope, i.e., the change in the resonant frequency of the two resonant circuits 5, 13, will, upon change in the discriminator output voltage by a fixed amount within the limits of points 1 and 2 of FIGURE 1, fluctuate but little, while the slope of the characteristic at point 1 will differ from the slope at point 2 by several orders of magnitude.

It is, of course, possible to use a separate tube for amplifying the control voltage, for separating the resistance chain 21, 22, 23, 24, from the discriminator, as well as for providing a high-ohmic output for the discriminator. But it is a substantial advantage of the present invention that the high frequency amplifier tube 4, which has to be provided in any case, is also used for these purposes.

FIGURE 1 also shows switches 30, 31, by means of which the potentiometer 23 and its tap can be taken out of the circuit and be replaced by a different potentiometer 32. The potentiometer 32 will be set for different receiving frequencies, the arrangement being such that the actuation of one of the two switches 30, 31, will automatically deactivate the other. If the switches are fashioned as push buttons, it is thus possible very easily to set the circuit for different operating frequencies. It will, of course, be understood that the circuit is not limited to two potentiometers 23, 32, but that any desired number of potentiometers can be provided, any one of which can be switched into the circuit. In practice, it has been found that an automatic push button arrangement enabling any one of a plurality of potentiometers to be switched in is particularly desirable for automobile radios.

When one of the potentiometers 23, 32, etc., is being tuned to a particular transmitter, it is expedient to ground the discriminator by means of a switch 33, so that, upon switching on the control voltage, the discriminator will operate as near as possible to the point at which the characteristic of the discriminator passes through zero. Inasmuch as the signal obtained through a loudspeaker is, during tuning of the potentiometer while the control circuit is on, equally good throughout a certain setting range, namely, the hold-in range of the control circuit, the operator will not know to what point the potentiometer should be set. This drawback can be avoided, for example, by providing an interlock arrangement by means of which a flap covering the operating knobs of the potentiometer automatically closes the switch 33 when such flap is raised. Instead of the switch 33, a switching element 20 having an S-shaped characteristic can be provided, i.e., an element which becomes very low-ohmic and thereby short-circuits the control voltage either when the voltage is above a certain positive voltage or below a certain negative voltage. In this way, the hold-in range of the control circuit can, with large control slope, be reduced so that a plurality of transmitters will not fall into the hold-in range at the same time.

It is particularly expedient if the setting means shown within the block 34 are physically built together to form a remote control unit. Inasmuch as only D.C. voltages will have to be transmitted, the unit can be connected to the receiver with an ordinary multiple lead cable; this cable can, of course, be as long as desired.

In view of the fact that the characteristic of the capacitance diodes has a marked curvature, as is apparent from FIGURE 1, it is expedient to use as potentiometers 23, 32, potentiometers having approximately logarithmic characteristics. As a result, the receiving frequency to which the receiver is adjusted has an approximately linear relationship with the angular position of the potentiometer tap. Consequently, a frequency scale associated with the potentiometer knob will have the numerical frequency values spaced substantially equidistantly apart.

The invention is furhter adapted for use with the input circuits of television receivers. For example, the receiver can be tuned to receive all of the channels of a band by controlling capacitance diodes incorporated in circuits similar to the input and oscillator circuits shown in FIGURE 2, so that only the switch-over from one band to another will have to be accomplished mechanically. Here, too, it is possible and expedient to switch in the individual channels by applying selected fixed D.C. voltages, as bias voltages, to the diodes.

FIGURE 3 shows a channel switch for use in the very high frequency (VHF) range of a television receiver. The television antenna 35 feeds the input circuit 36 of a cascode stage 37, 38, to whose output there is connected a bandfilter having a primary winding 39 and a secondary winding 40, which filter is tunable over the VHF range. The amplified high frequency or RF voltage is applied, via a capacitor 41, to the grid of a mixer stage tube 42. The oscillator is constituted by a tube 43 which has a feedback coil 44 connected to the cathode. The oscillator voltage, whose frequency is dependent on the grid circuit 45, is applied, via a capacitor 46, to the mixer stage tube 42. The resonant circuit capacitances of circuits 36, 39, 40, 45, consists of capacitors 47, 48, 49, 50, respectively, each serially connected with a respective capacitance diode 51, 52, 53, 54. These diodes are biased, via resistance 55, 56, 57, 58, respectively, with a common D.C. voltage from point A. The capacitance of each of the diodes is varied by regulating this D.C. voltage, and the circuits 36, 39, 40, 45, can simultaneously be tuned to all of the input channels, or at least to the input channels of one particular band. The inductances are either not exchanged at all, or at most only when the receiver is switched from one band to another. Alternatively, each circuit includes an inductance 59, shown in FIGURE 3*a*, which has the necessary inductance to enable the set to operate at the lowermost frequency band, which inductance, for operation at a higher frequency band, is partially short-circuited by means of a switch 60.

The channel tuning is done, for example, by means of an infinitely variable potentiometer 61, shown in FIGURE 3, which is part of a voltage divider including the resistances 62, 63, through which voltage divider there flows a direct current. As in the case of the circuit of FIGURE 2, a further direct control current derived from a frequency control circuit is caused to flow through the resistance chain 62, 61, 63.

Under certain circumstances, it may be deemed preferable to obtain the D.C. voltages needed for the various channels by properly setting a corresponding number of individual potentiometers 64, 65, 66, 67, and to derive whatever voltage is needed from the proper potentiometer by means of a selector switch 68. These potentiometers may be connected in parallel, as shown in FIGURE 3*b*, so that the setting of any one potentiometer will not affect the voltage derived from any other potentiometer. Alternatively, the potentiometers 69, 70, 71, 72, can be serially connected, as shown in FIGURE 3*c*, thereby reducing the loading on the D.C. voltage source.

FIGURE 3 clearly shows the advantage of the present invention. It was heretofore customary to provide relatively complicated and expensive channel switches in which the channel switching was brought about by switching coils mounted on the drum forming part of the switch. This means that in the case of twelve channels and four circuits $12\times4=48$ coils were required. In contradistinction thereto, a circuit arrangement according to the present invention requires only four fixed coils, at least for any one frequency band. Channel switching can be accomplished by means of a simple rotary switch or by means of a set of push buttons which can easily be mounted any place on the television receiver or be built into a remote control unit. Another advantage of the present invention is that all mechanical high frequency contacts, heretofore considered necessary for purposes of channel switching, are eliminated, thereby not only reducing the costs to a substantial degree but, even more important, effectively eliminating a large source of potential operating difficulties.

FIGURE 4 is a complete schematic diagram of a circuit according to FIGURE 2, the various tube and diode types, as well as the numerical values of the electrical components being shown directly in FIGURE 4.

It will be understood that the above description of the present invention is susceptible to various modifications, changes, and adaptations, and the same are intended to be comprehended within the meaning and range of equivalents of the appended claims.

What is claimed is:

1. In a piece of communication equipment having resonant circuit means incorporating capacitance diode means of the type whose capacitance can be varied by the application of a bias voltage, the capacitance characteristic of said diode means being non-linear and therefore having different slopes at various points along its length, the piece of communication equipment further having a frequency control circuit from which is derived a control voltage for automatically fine tuning said diode means, a tuning circuit for varying the capacitance of said diode means and hence the operating frequency of the piece of communication equipment, said tuning circuit comprising: a voltage divider having a tap connected to said diode means; means for passing a stabilizing D.C. through said voltage divider; and means for deriving a control D.C. from said frequency control circuit and passing the same through said voltage divider; said voltage divider, under the influence of said stabilizing D.C. and said control D.C., being a means for delivering at its tap and therefore for applying to said diode means only a small portion of said control voltage when said diode means is biased to operate at a point whereat its capacitance characteristic has a steep slope and a large portion of said control voltage when said diode means is biased to operate at a point whereat its capacitance characteristic has a small slope, in consequence of which the effect of the control voltage on the capacitance of said diode means, and hence on the frequency of the resonant circuit means of which said diode means are a part, remains substantially constant throughout the frequency band over which the piece of communication equipment is tuned by the varying of the capacitance of said diode means.

2. The combination defined in claim 1 wherein the piece of communication equipment incorporates a tube controlled by said control voltage which tube itself has an anode circuit, and wherein said means for deriving the control D.C. from said frequency control circuit comprise said anode circuit of said tube, said tube being controlled by said frequency control circuit.

3. A tuning circuit as defined in claim 2 wherein said tube is a high-frequency amplifier tube.

4. A tuning circuit as defined in claim 1 wherein said voltage divider comprises a potentiometer having a logarithmic characteristic.

References Cited by the Examiner

UNITED STATES PATENTS

| | | | |
|---|---|---|---|
| 2,936,428 | 5/1960 | Schweitzer | 325—428 X |
| 3,029,339 | 4/1962 | Pan | 325—468 |
| 3,110,004 | 11/1963 | Pope | 307—88.5 |

FOREIGN PATENTS

| | | |
|---|---|---|
| 1,033,282 | 7/1958 | Germany. |

ROBERT H. ROSE, *Primary Examiner.*

DAVID G. REDINBAUGH, *Examiner.*